United States Patent [19]

Fujita et al.

[11] 4,444,616
[45] Apr. 24, 1984

[54] METHOD FOR EXPOSURE OF CHEMICALLY MACHINABLE LIGHT-SENSITIVE GLASS

[75] Inventors: Yoshimi Fujita; Toshiharu Yamashita, both of Tokyo, Japan

[73] Assignee: Hoya Corporation, Tokyo, Japan

[21] Appl. No.: 384,111

[22] Filed: Jun. 1, 1982

[30] Foreign Application Priority Data

Jun. 2, 1981 [JP] Japan ................................. 56-83843

[51] Int. Cl.³ .......................... B44C 1/22; C03C 15/00; C03C 25/06
[52] U.S. Cl. ..................................... 156/628; 156/643; 156/644; 156/654; 156/663; 250/492.1; 430/321
[58] Field of Search ............... 156/628, 643, 644, 654, 156/657, 659.1, 663, 639; 250/492.1; 430/321; 65/31

[56] References Cited

U.S. PATENT DOCUMENTS 2,628,160 2/1953 Stookey ........................... 156/663 X
4,276,335 6/1981 Lemmond ........................ 156/643 X Primary Examiner—William A. Powell
Attorney, Agent, or Firm—Sughrue, Mion, Zinn, Macpeak & Seas

[57] ABSTRACT

A method for irradiating a chemically machinable light-sensitive glass plate with a parallel bundle of ultraviolet rays so as to form tapered holes or slits in the glass plate. A mask having a desired shaped opening is mounted on the light-sensitive glass plate and the plate is disposed so that its surface forms a predetermined angle with a plane which is perpendicular to the parallel bundle of ultraviolet rays. The glass plate is then rotated about a central vertical axis thereof.

8 Claims, 5 Drawing Figures

METHOD FOR EXPOSURE OF CHEMICALLY MACHINABLE LIGHT-SENSITIVE GLASS

BACKGROUND OF THE INVENTION

1. Field of the Invention

The present invention is a method for irradiating a chemically machinable light-sensitive glass with a parallel bundle of ultraviolet rays to form tapered holes or slits in the light-sensitive glass.

2. Description of the Prior Art

Holes or slits are often formed in a chemically machinable light-sensitive glass by irradiating the glass with ultraviolet rays through a mask placed on the surface of the glass. After the irradiation, the glass is heated causing fine lithium metasilicate ($SiO_2$-$Li_2O$) crystals to grow in the irradiated area. When the thus irradiated and heated glass is treated with a hydrofluoric acid solution, the crystal area dissolves at a faster rate than the non-irradiated area of the glass forming holes or slits in the irradiated areas. The above method is used to make perforations, engravings, channels and cuttings in chemically machinable light-sensitive glass.

In accordance with the conventional method for irradiation with ultraviolet rays which has heretofore been used to perforate chemically machinable light-sensitive glass, a parallel bundle of ultraviolet rays is applied vertically or obliquely to the glass plate with a mask mounted thereon. The mask has openings corresponding in shape and dimension to holes to be formed in the glass plate. In the conventional method, the light source and the light-sensitive glass plate are always kept in the same relative positional relationship. Thus, the diameter of the holes finally formed in the glass plate by application of hydrofluoric acid solution treatment is uniform in the direction of thickness of the glass even though the holes may be oriented vertically or obliquely relative to the glass plate. Typical holes formed by the conventional method are shown in FIG. 1(a). As can be seen, it is not possible to produce tapered holes such as those shown in FIG. 1(b) wherein the hole diameter increases in the direction of thickness of the glass plate according to the conventional method.

SUMMARY OF THE INVENTION

Accordingly, an object of the present invention is to provide a method for irradiation of chemically machinable light-sensitive glass with a parallel bundle of ultraviolet rays which permits the formation of tapered holes or slits as shown in FIG. 1(b) in the glass when the irradiated glass is heated and then treated with a hydrofluoric acid solution.

In the present invention, a mask having an opening therein is mounted on a surface of a glass plate and the plate is disposed below a light source which is capable of generating a parallel bundle of ultraviolet rays in such a manner that the ultraviolet rays enter the glass at a predetermined angle of incidence. The mask and glass plate are then rotated about a center axis of the glass plate. Alternatively, the light source can be revolved about a center axis of the glass plate. The glass plate is then heated and etched with acid in the conventional manner.

DESCRIPTION OF THE PREFERRED EMBODIMENTS

Figure 1A:
FIG. 1(a) is an enlarged cross-sectional view of a light-sensitive glass plate in which holes have been formed by the conventional method.
Figure 1B:
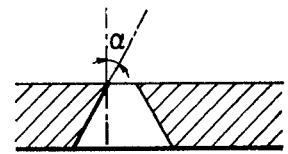
FIG. 1(b) is an enlarged cross-sectional view of a light-sensitive glass plate in which holes have been formed by the exposure method of the present invention.
Figure 2A:
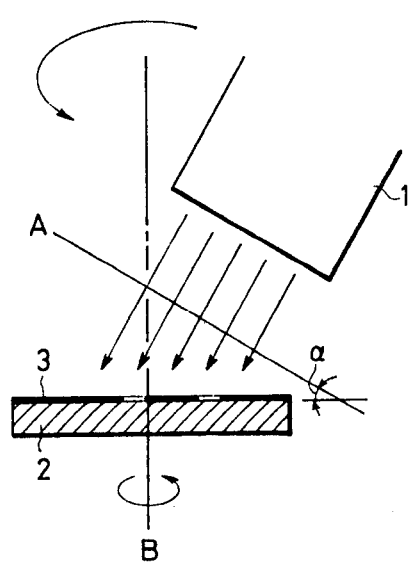
FIGS. 2(a) and 2(b) are schematic illustrative views of the method of the present invention.
Figure 2B:
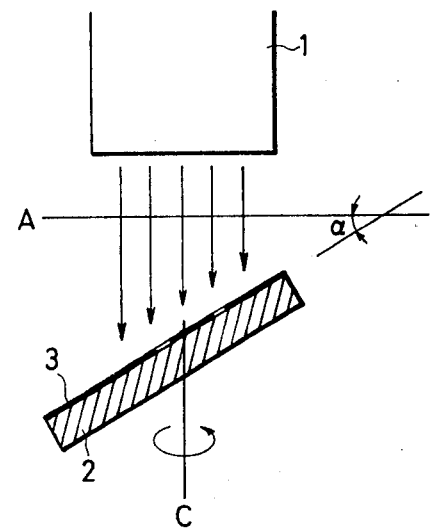

FIGS. 2(a) and 2(b) illustrate the positional relationship between a light source 1 capable of generating a parallel bundle of ultraviolet rays, a chemically machinable light-sensitive glass plate 2, and a mask 3 having openings of a desired form. The mask 3 is mounted on the surface of the light-sensitive glass plate 2. The light source 1 and the light-sensitive glass plate 2 face each other through the mask 3, and they are positioned so that an acute angle $\alpha$ formed between a plane A which is perpendicular to the parallel bundle of ultraviolet rays and a plane which is parallel to the surface of the glass plate 2 is equal to the desired taper angle (see FIG. 1(b)).

In accordance with an embodiment of the method of the invention, as illustrated in FIG. 2(a), the light-sensitive glass plate 2 is exposed to the parallel bundle of ultraviolet rays from the light source 1 while the light-sensitive glass plate is rotated about a vertical central line B. Alternatively, the light source 1 can revolve about the vertical central line B.

In the other embodiment of the method of the invention, as illustrated in FIG. 2(b), the light-sensitive glass plate 2 is exposed to the parallel bundle of ultraviolet rays from the light source 1 while rotating the light-sensitive glass plate 2 about a central line C of the parallel bundle of ultraviolet rays as an axis of rotation.

In general, the revolving motion of the light source is difficult to perform and requires that a relatively large amount of motion be induced as compared with the motion generated by rotating the light-sensitive glass plate. Therefore, for practical purposes, it is recommended that the light-sensitive glass plate 2 be rotated with the central line B or C forming the axis of rotation.

Figure 3:
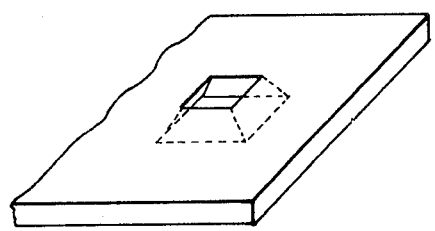
FIG. 3 is a perspective view of a light-sensitive glass plate in which the desired hole is formed by application of a hydrofluoric acid solution after the irradiation with a parallel bundle of ultraviolet rays according to the method of the present invention.

The speed of rotation of the light-sensitive glass plate or light source is controlled depending on the output of the light source and the thickness of the light-sensitive glass plate. For example, when a 600 W Xe-Hg lamp is used as a light source, the light-sensitive glass plate is exposed to the parallel bundle of ultraviolet rays while rotating the light-sensitive glass plate or light source at a speed of rotation of once per minute and the glass plate is then heat treated at 590° C. for one hour. Thereafter, by etching the thus treated light-sensitive glass plate in a 5% hydrofluoric acid solution for three hours, a tapered hole as shown in FIG. 3 can be formed in a 1 mm thick light-sensitive glass plate.

It is preferred to apply the etching treatment from only one side of the glass plate since when the etching treatment is applied from both sides of the glass plate, the hole swells near a central part of the hole and, therefore, it is not possible to form a hole tapered at a predetermined angle.

In accordance with the method of the invention, holes or slits tapered at a desired angle can be formed in a light-sensitive glass plate by controlling the acute angle $\alpha$ as shown in FIGS. 2(a) and 2(b). Thus, the method of the invention is very useful in the preparation of cell sheets for plasma display and the like.

We claim:

1. A method for irradiating a chemically machinable light-sensitive glass plate with a parallel bundle of ultraviolet rays, comprising the steps of:
    mounting a mask having an opening therein on a surface of said glass plate;
    mounting a light source capable of generating said parallel bundle of ultraviolet rays above said mask so that an angle formed between a plane which is perpendicular to said parallel bundle of ultraviolet rays and a plane which is parallel to said surface of said glass plate is equal to a desired taper angle;
    irradiating said plate with said parallel bundle of ultraviolet rays; and
    rotating said glass plate about a center axis thereof.

2. The method claimed in claim 1 wherein said center axis is perpendicular to said surface of said glass plate.

3. The method claimed in claim 1 wherein said center axis is parallel to said parallel bundle of ultraviolet rays.

4. The method claimed in claim 2 or 3 further comprising the step of heating said glass plate to form lithium metasilicate crystals.

5. The method claimed in claim 4 further comprising the step of treating said glass plate with a hydrofluoric acid solution on only one side of said glass plate.

6. A method for irradiating a chemically machinable light-sensitive glass plate with a parallel bundle of ultraviolet rays, comprising the steps of:
    mounting a mask having an opening therein on a surface of said glass plate;
    mounting a light source capable of generating said parallel bundle of ultraviolet rays over said mask so that an angle formed between a plane which is perpendicular to said parallel bundle of ultraviolet rays and a plane which is parallel to said surface of said glass plate is equal to a desired taper angle;
    irradiating said plate with said parallel bundle of ultraviolet rays; and
    revolving said light source about a center axis of said glass plate, said center axis being perpendicular to said surface of said glass plate.

7. The method claimed in claim 6 further comprising the step of heating said glass plate to form lithium metasilicate crystals.

8. The method claimed in claim 7 further comprising the step of treating said glass plate with a hydrofluoric acid solution on only one side of said glass plate.

* * * * *